United States Patent [19]

Kanezawa et al.

[11] Patent Number: 5,095,407
[45] Date of Patent: Mar. 10, 1992

[54] DOUBLE-SIDED MEMORY BOARD

[75] Inventors: Yukio Kanezawa, Koganei; Masayuki Watanabe, Yokohama; Toshio Sugano, Kokubunji, all of Japan

[73] Assignee: Hitachi, Ltd., Tokyo, Japan

[21] Appl. No.: 397,352

[22] Filed: Aug. 23, 1989

Related U.S. Application Data

[63] Continuation of Ser. No. 130,510, Dec. 9, 1987, abandoned.

[30] Foreign Application Priority Data

Feb. 27, 1987 [JP] Japan ................................ 62-42677

[51] Int. Cl.⁵ .............................................. H05K 1/11
[52] U.S. Cl. ..................................... 361/414; 361/406
[58] Field of Search ............. 174/52 FP, 52 PE, 68.5; 357/75, 80; 361/400, 403, 406, 409, 414

[56] References Cited

U.S. PATENT DOCUMENTS

| | | | |
|---|---|---|---|
| 3,546,539 | 12/1970 | Wilcox, Jr. ...................... | 361/406 X |
| 3,564,114 | 2/1971 | Blinder et al. ..................... | 174/68.5 |
| 3,917,984 | 11/1975 | Kong et al. ....................... | 361/400 X |
| 4,190,901 | 2/1980 | Johnson et al. .................. | 361/409 X |
| 4,255,852 | 3/1981 | Johnson et al. .................. | 174/68.5 X |
| 4,413,309 | 11/1983 | Takahashi ....................... | 361/400 X |
| 4,490,775 | 12/1984 | Quan ............................... | 361/406 X |
| 4,551,789 | 11/1985 | Schettler et al. ................ | 361/406 X |
| 4,580,193 | 4/1986 | Edwards ......................... | 361/406 X |
| 4,672,421 | 6/1987 | Lin ........................................ | 357/80 |
| 4,682,207 | 7/1987 | Akasaki et al. ................. | 174/52.5 X |

OTHER PUBLICATIONS

F. Tsui, Engineering Change Wire Modifications in Josephson Technology, IBM Tech. Disc. Bull., vol. 24 #4, Sep. 1981, pp. 1987 to 1990.

"Electronic Materials", Kogyo Chosakai Publishing Co., Ltd., Tokyo, for Oct. 1983, pp. 15–164, for Oct. 1984, pp. 15–128, and for Apr., 1984, pp. 143–148.

Primary Examiner—Gregory D. Thompson
Attorney, Agent, or Firm—Pennie & Edmonds

[57] ABSTRACT

A face-mounting type memory module board wherein the number of through-holes is reduced by a large margin in order to improve the reliability of the board. $V_{CC}$ and $V_{SS}$ plates which have heretofore been provided inside a multi-layer wiring board are disposed on the reverse surface of a single-layer wiring board, and other wirings are disposed on its obverse surface by making use of a fine process, thereby greatly reducing the number of through-holes required.

25 Claims, 13 Drawing Sheets

DOUBLE-SIDED MEMORY BOARD

This is a continuation, of application Ser. No. 07/130,510 filed Dec. 9, 1987, now abandoned.

BACKGROUND OF THE INVENTION

The present invention relates to a printed board for face mounting and, more particularly, to an improvement in a double-sided printed board.

A typical conventional printed board which incorporates a $V_{SS}$ plate (power supply plate) is formed using a multi-layer board, and the $V_{SS}$ plate is provided in its inner layer.

The following is one example of a structure of a multi-layer board, e.g., a four-layer structure, having the $V_{SS}$ plate in its inner layer.

Namely, obverse surface wirings are provided on the obverse surface of the board, while reverse surface wirings are provided on its reverse surface. Through-holes are provided in the board, and conductors are disposed inside the through-holes to provide electrical communication between the obverse and reverse surface wirings. Further, a double-layer $V_{SS}$ plate (power supply layer) consisting of first and second $V_{SS}$ plate layers is provided inside the board so that the power supply layer extends perpendicularly to the through-hole conductors.

In general, the above-described multi-layer board is produced by stacking a necessary number of resin sheets each having a pattern formed thereon, heating them under pressure to harden the resin, providing holes (through-holes) at necessary positions with a drill, and disposing conductors inside the holes to thereby make the patterns conductive to each other.

It should be noted that the printed board is described, for example, in the "Electronic Materials", Kogyo Chosakai Publishing Co., Ltd., Tokyo, for October, 1983, pp. 15–164, for October, 1984, pp. 15–128, and for April, 1984, pp. 143–148.

SUMMARY OF THE INVENTION

The present inventors examined the above-described prior art and, as a result, have found that it suffers from the following problems.

In the prior art, the reverse surface wirings are provided in addition to the obverse surface wirings, and through-holes are provided. Further, conductors are deposited inside the through-holes by plating or other similar means in order to provide electrical communication between these wirings. In addition, a plurality of resin sheets each having a $V_{SS}$ plate formed thereon are stacked up and heated under pressure so as to be laminated. Accordingly, the production cost of the printed board is disadvantageously high. Further, since a plurality of resin sheets are laminated to obtain a predetermined thickness, it is difficult to effect control for obtaining a desired thickness of the printed board. Further, employment of through-hole conductors to provide electrical communication between the obverse and reverse surface wirings hinders improvement in reliability since in many cases such through-holes cannot be provided with high reliability. It is disadvantageously necessary to provide a large number of through-holes in the conventional printed board, and the board is readily cracked under pressure and therefore inferior in terms of press-workability.

Accordingly, it is an object of the present invention to provide a memory board of high reliability.

It is another object of the present invention to provide a memory board which is suitable for face mounting.

It is still another object of the present invention to provide a memory board having a high degree of accuracy in terms of thickness.

It is a further object of the present invention to provide a memory board which is so designed that it is possible to effect mounting at a high density.

It is a still further object of the present invention to provide a memory board which is free from generation of bend.

It is a still further object of the present invention to provide a printed board which is so designed that it is possible to prevent oxidation of the wiring layer provided on the obverse surface.

It is a still further object of the present invention to provide a wiring board technique which enables provision of closely spaced wirings which are not readily shorted.

It is a still further object of the present invention to provide a memory board which is easy to manufacture.

It is a still further object of the present invention to provide a layout for a memory board which enables reduction in crosstalk between wirings.

It is a still further object of the present invention to provide a memory board which has a reduced production cost.

It is a still further object of the present invention to provide a daughter memory board which is able to be mounted on a mother board at a high density.

It is a still further object of the present invention to provide a memory board which is suitable for packages similar to dual in-line packages such as SOP (Small Outline Package), SOL (Small Outline J-Bend Package), etc.

It is a still further object of the present invention to provide a technique for mounting circuit elements on a printed board which is suitable for double-sided mounting.

It is a still further object of the present invention to provide a mounting technique which is suitable for a microcomputer having various kinds of IC and VLSI mounted on a printed board.

A typical one of the novel techniques disclosed in this application will briefly be summarized as follows.

According to the present invention, the greater part of wirings which have heretofore been provided on the reverse surface of a printed board are disposed on the obverse surface by making use of a fine process, while a $V_{SS}$ plate which has heretofore been provided in the inner layer is disposed on the reverse surface, thus forming a double-sided printed board with a $V_{SS}$ plate disposed one side thereof.

Since the greater part of the wirings which have heretofore been provided on the reverse surface are moved to the obverse surface, it is possible to greatly reduce the number of through-holes which are required in order to provide electrical communication between the obverse and reverse surface wirings. Further, since the $V_{SS}$ plate is not laid in the inner layer, it is unnecessary to laminate a plurality of resin sheets each having a $V_{SS}$ plate pattern as in the case of the prior art, and it is possible to form a printed board from a single resin sheet. Accordingly, the production cost is lowered, and it is easy to effect control for obtaining a predetermined thickness of the printed board. Further, it is possible to reduce the number of required through-holes by a large margin, and this enables an improvement in reliability, simplification of the fabrication process, and an increase in the production yield. In addition, the $V_{SS}$ plate disposed on the reverse surface provides a shielding effect. Thus, it is possible to obtain a double-sided printed board with a $V_{SS}$ plate which has various excellent features and advantages.

DETAILED DESCRIPTION OF THE PREFERRED EMBODIMENTS

(1) Embodiment 1

The present invention will be described hereinunder by way of embodiments and with reference to the accompanying drawings.

Figure 1:
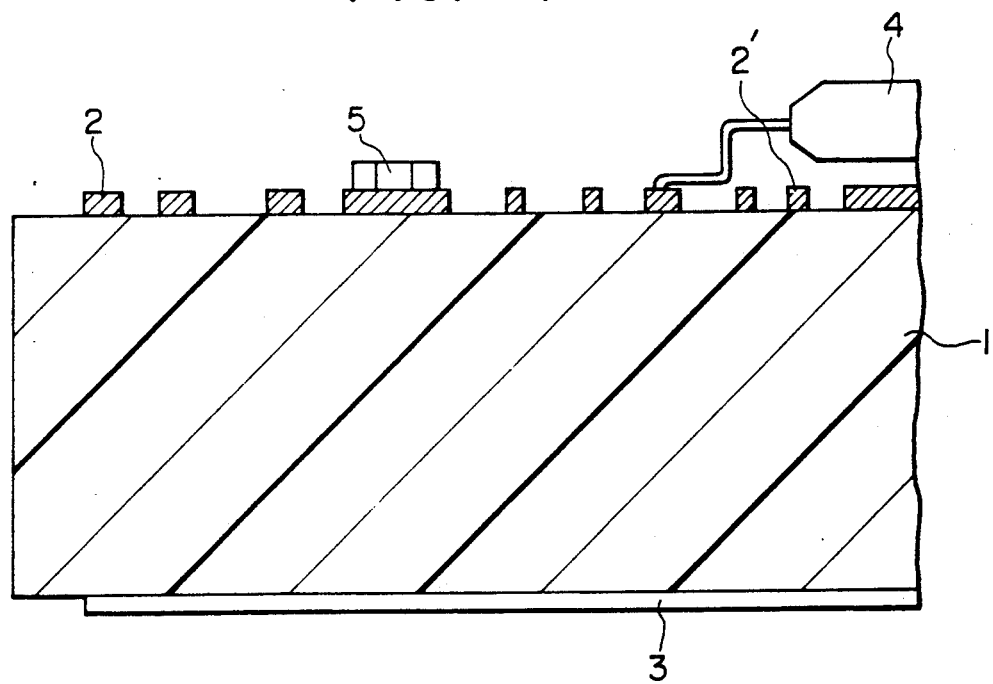
FIG. 1 is a fragmentary sectional view of a first embodiment of the present invention.
Figure 2:
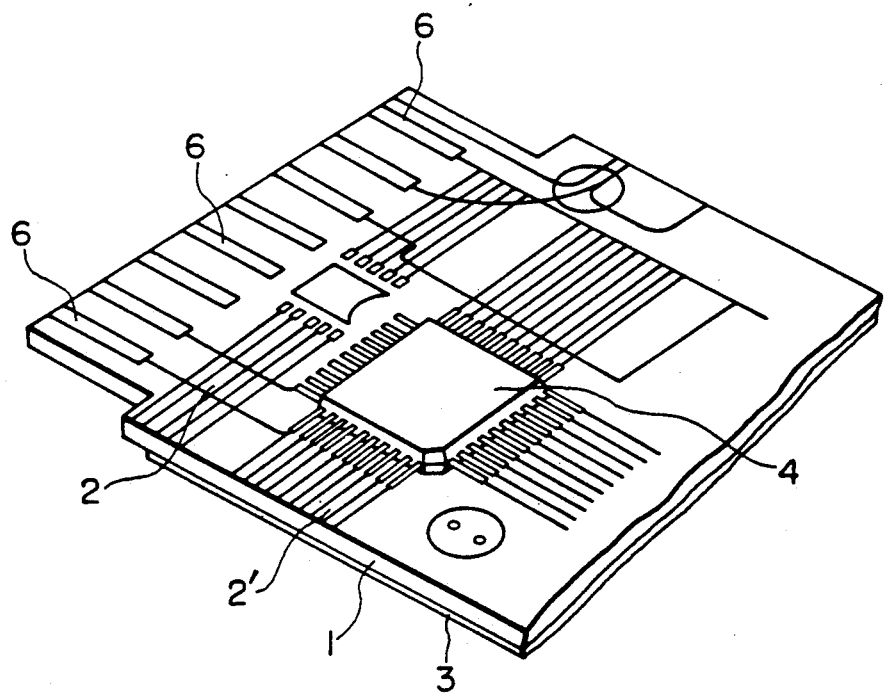
FIG. 2 is a fragmentary perspective view of the first embodiment of the present invention.

FIG. 1 is a fragmentary sectional view of a first embodiment of the present invention, while FIG. 2 is a fragmentary perspective view of the first embodiment.

As shown in these figures, obverse wirings 2 are formed on the obverse surface of a board 1, and a $V_{SS}$ plate 3 is disposed on the reverse surface of the board 1.

The board 1 is formed from, for example, a resin board. Various kinds of resin board are available by combining a variety of base materials and binders. Examples of base materials which are appropriately employed in the present invention include glass fibers, paper and synthetic fibers, and examples of binders are epoxy resins, phenolic resins and polyimide. As the resin board, an epoxy resin board formed using glass fibers as a base material, i.e., a glass-epoxy board, is preferable.

In formation of the wirings 2 on the obverse surface of the board 1, the greater part of the wirings which have heretofore been provided on the reverse surface are disposed on the obverse surface in the form of fine wirings by making use of a fine process.

The formation of the wirings 2 on the obverse surface of the board 1 is effected as follows. For example, glass fibers which are knitted in the form of cloth are impregnated with an epoxy resin and then dried to thereby form glass-epoxy sheets. A number (e.g., 15 to 16) of thus prepared glass-epoxy sheets are stacked so that a necessary thickness is obtained, and copper foil is laid on the surface of the stack of glass-epoxy sheets. Thereafter, this stack of sheets is heated under pressure to form a copper-coated glass-epoxy laminated board, and conductor wiring patterns 2 are formed on the laminated board by making full use of etching and photoresist techniques.

The $V_{SS}$ plate 3 is also formed by laying copper foil on the reverse surface in the above-described process, and then similarly patterning the copper foil as desired by etching and photoresist techniques.

As shown in FIG. 1, almost all the conductor wiring patterns 2 are formed on one surface of the board 1, and it is therefore unnecessary to provide through-hole conductors which have heretofore been required to provide electrical communication between the conductor wiring patterns formed on the obverse and reverse surfaces. However, through-hole conductors may be formed according to need. Further, as shown in FIG. 1, no $V_{SS}$ plate is provided inside (in the inner layer) the board 1, but the $V_{SS}$ plate 3 is provided on the reverse surface of the board 1.

Individual parts such as a semiconductor element 4 and a resistor or capacitor 5 can be mounted on the conductor wiring patterns 2 formed on the obverse surface of the board 1.

If the conductor wirings which have heretofore been provided on the reverse surface are disposed under the individual parts 4, 5, then, for example, the fine wiring pattern 2' is protected by the element 4.

It should be noted that the reference numeral 6 in FIG. 2 denotes terminal portions on the board 1.

According to the present invention, a printed board having a $V_{SS}$ plate is arranged in the form of a double-sided printed board having the $V_{SS}$ plate provided on one surface thereof, whereas the $V_{SS}$ plate has heretofore been provided in the inner layer of the conventional printed board. More specifically, the greater part of the wirings which have heretofore been provided on the reverse surface are disposed on the obverse surface by making use of a fine process so that most of the conductor wiring patterns 2 are disposed on the obverse surface of the board 1, and the $V_{SS}$ plate is provided on the reverse surface having a vacant space resulting from the movement of the wiring patterns to the obverse surface.

Unlike the prior art in which a plurality of resin sheets each having a $V_{SS}$ plate formed thereon are laminated and provided with through-holes for providing electrical communication between the obverse and reverse wirings and further conductors are deposited inside the through-holes to form a multi-layer board incorporating a $V_{SS}$ plate, the present invention which features the above-described arrangement enables simplification in terms of materials and fabrication processes, lowering in the unit cost of the printed board, facilitation of the thickness control, improvement in the production yield and facilitation of press working. Thus, it is possible to lower the production cost, and since the number of required through-holes can be reduced by a large margin, the disconnection potential lowers. In addition, since the $V_{SS}$ plate 3 is disposed on the reverse surface, it is possible to avoid the problem that the wirings formed on the reverse surface of the board 1 may be damaged, and it is also possible to provide a shielding effect by virtue of the plate 3.

Although the invention accomplished by the present inventors has been specifically described above by way of one embodiment, the present invention is not necessarily limitative to the described embodiment and various changes and modifications may, of course, be imparted thereto without departing from the gist of the invention.

For example, although in the above-described embodiment the present invention is exemplarily applied to a printed board, the invention may also be applied to a ceramic board or the like.

The printed board according to the present invention can suitably be employed for a memory module, a computer and other purposes, for example, as a printed board for mounting various parts on its surface.

(2) Embodiment 2

A memory module according to a second embodiment of the present invention will next be explained.

Figure 3:
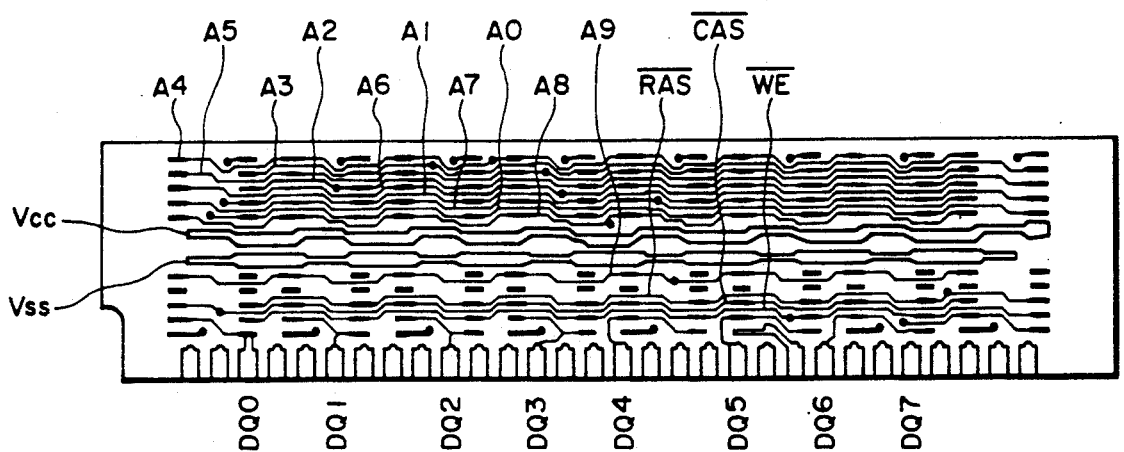
FIG. 3 is a plan view of a printed-wiring board used for a memory module in accordance with a second embodiment of the present invention, which shows wiring patterns only on the upper surface (a main mounting surface for face mounting parts) of the wiring board.

FIG. 3 shows copper wiring patterns formed on the obverse surface (where face mounting devices are mainly mounted) of a printed board. In the figure, a pair of wiring belts which extend horizontally (as viewed in FIG. 3) in the center are power supply wirings $V_{CC}$ and $V_{SS}$, respectively. Groups of substantially rectangular footprint portions to which are soldered respective leads of resin-sealed ICs such as memory ICs are disposed at each of the obverse and reverse sides (as viewed in FIG. 3) of the pair of power supply wirings, each group consisting of five footprint portions which are regularly spaced apart from each other vertically (as viewed in FIG. 3). Lines which extend horizontally while passing through the areas defined between the footprints correspond to input signal lines, respectively, i.e., address lines $A_0$ to $A_9$ and control signals $\overline{RAS}$, $\overline{CAS}$ and $\overline{WE}$. Circular patterns on the signal lines denote through-holes. A row of patterns which are provided at the lower edge of the board are pad portions which are employed when this memory module board is connected to a mother board by the use of edge connectors.

The width of thin wires such as the address lines is about 0.2 mm, while the rectangular pads (footprints) for mounting ICs or the like are 0.6 mm by 1.81 mm, and the board is 20.30 mm by 88.90 mm.

Figure 4:
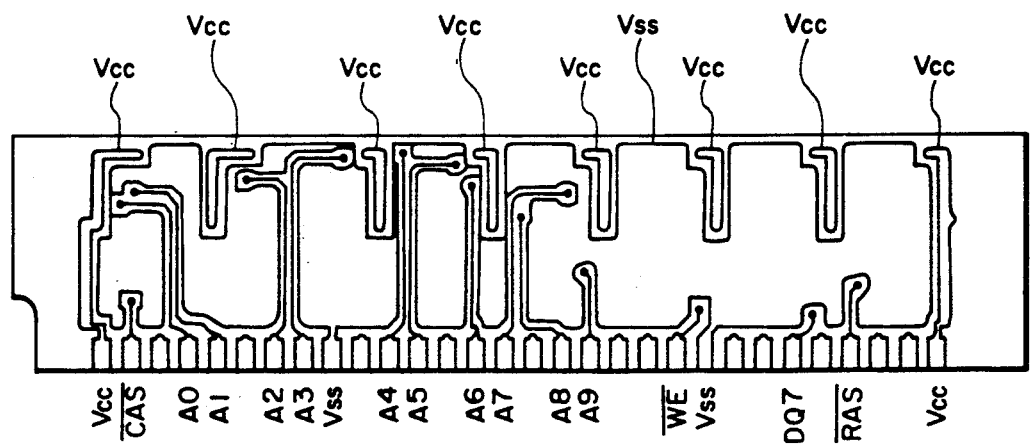
FIG. 4 is a plan view of the wiring board shown in FIG. 3, which shows wiring patterns only on the lower surface of the wiring board as viewed from the upper side.

FIG. 4 is a plan view of the printed board, which shows copper wiring patterns formed on the reverse surface as viewed from the obverse side with a view to facilitating the understanding of the positional relationship between the copper wiring patterns respectively formed on the obverse and reverse surfaces. A central continuous pattern which has a relatively wide area shows a $V_{SS}$ plate which is connected directly to the $V_{SS}$ wiring formed on the obverse surface through a plurality of through-holes. Elongated insular patterns which are disposed in respective recesses formed in the $V_{SS}$ plate correspond to the $V_{CC}$ wiring, these insular patterns being connected to the $V_{CC}$ wiring formed on the obverse surface through a plurality of through-holes in the same way as the above. Thin lines which extend substantially vertically between adjacent portions of the $V_{SS}$ plate provide electrical connection between the obverse surface wirings and pads through respective through-holes which are denoted by circular patterns. In FIGS. 3 and 4, DQ0 to DQ7 denote data input/output terminals.

Figure 5:
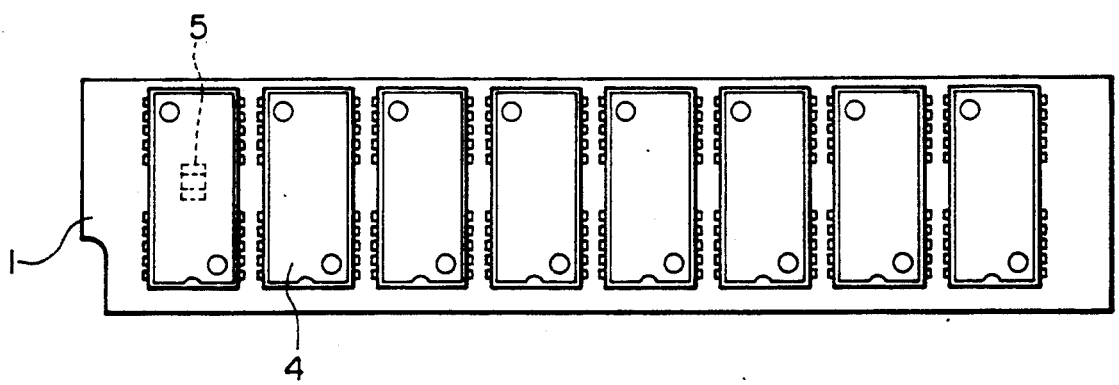
FIG. 5 is a plan view of the wiring board shown in FIG. 3, which shows the way in which memory ICs are mounted on the upper surface of the wiring board.

FIG. 5 shows the way in which memory ICs each encapsulated in a resin-sealed package of the SOJ (Small Outline J-bend package) type are mounted on the printed board shown in FIG. 3 by means of soldering.

Referring to FIG. 5, a face-mounting capacitor 5 is soldered between the pair of wirings $V_{CC}$ and $V_{SS}$ in the center of the glass-epoxy board 1, and an SOJ type memory device is mounted over the capacitor 5 with its leads soldered to the corresponding footprints shown in FIG. 3.

Figure 6:
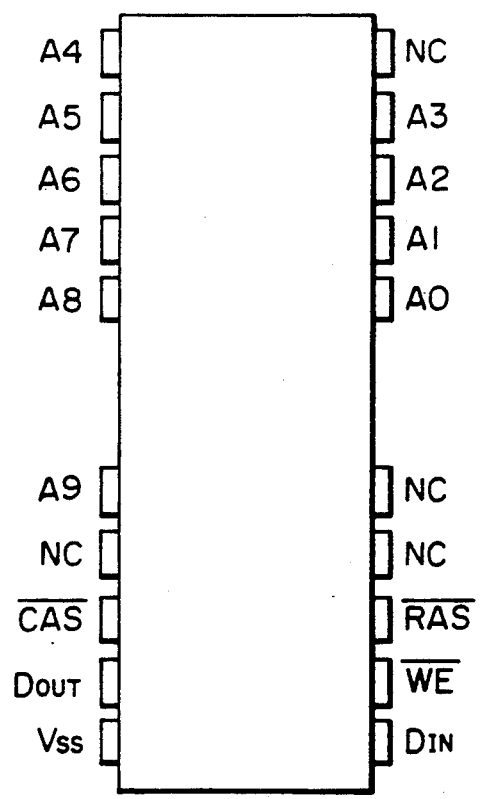
FIG. 6 shows array pinouts of one of the memory ICs shown in FIG. 5.

FIG. 6 shows array pinouts (pin arrangement) of the above-described SOJ type memory device (e.g., 1M-bit DRAM).

Figure 7:
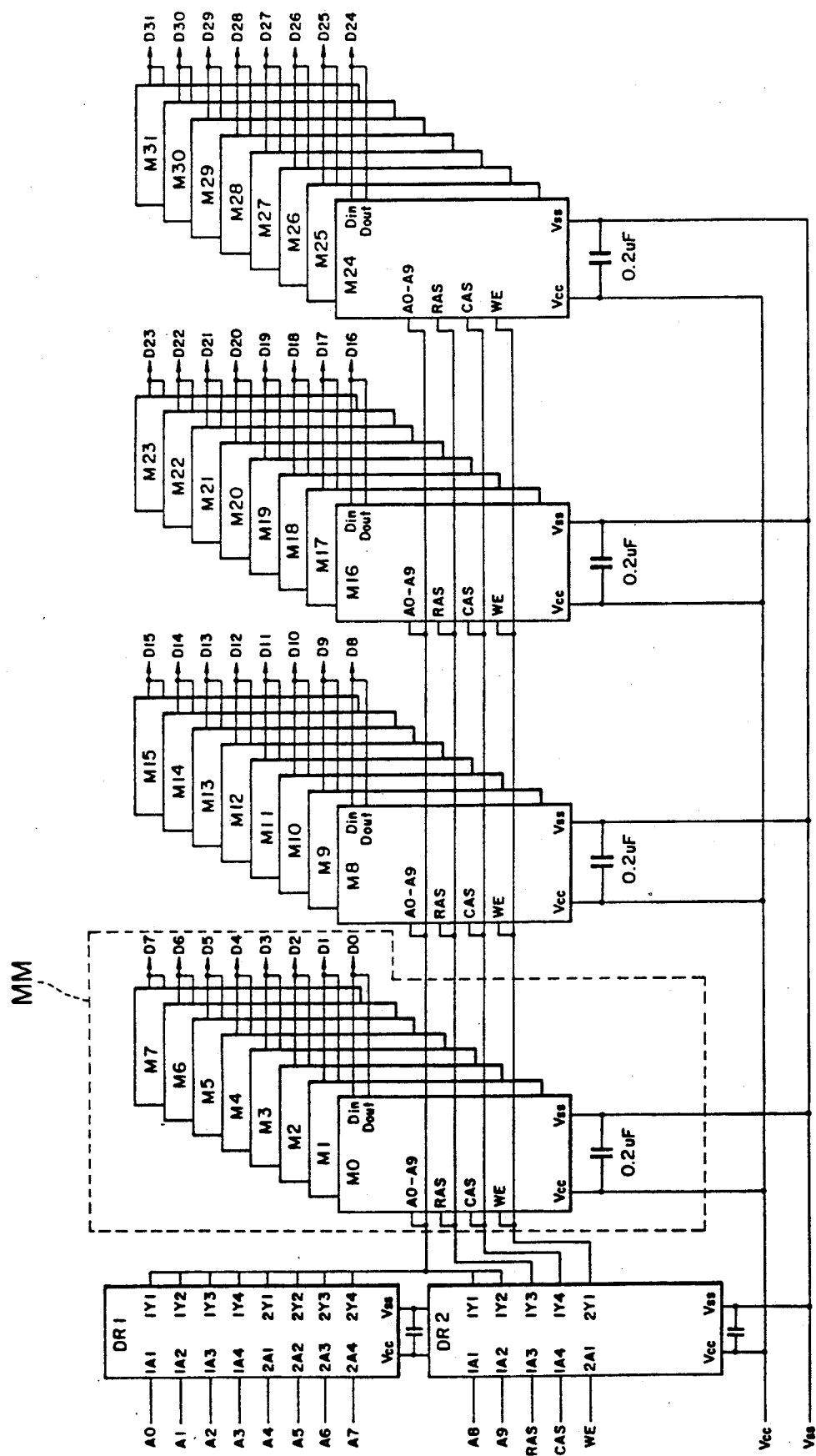
FIG. 7 is a circuit diagram of the memory module in accordance with the second embodiment of the present invention.

FIG. 7 shows a practical circuit of the memory module. In the figure, M0 to M31 denote SOJ type memory ICs such as that shown in FIG. 6 which are transfer-molded using an epoxy resin. DR1 and DR2 denote driver ICs for shaping the waveforms of address signals A0 to A9 and timing and control signals RAS, CAS and WE. In this embodiment, the driver ICs are externally mounted on a mother board. The memory module in this embodiment is shown by the chain line MM. D0 to D31 denote data input/output terminals.

Figure 8:
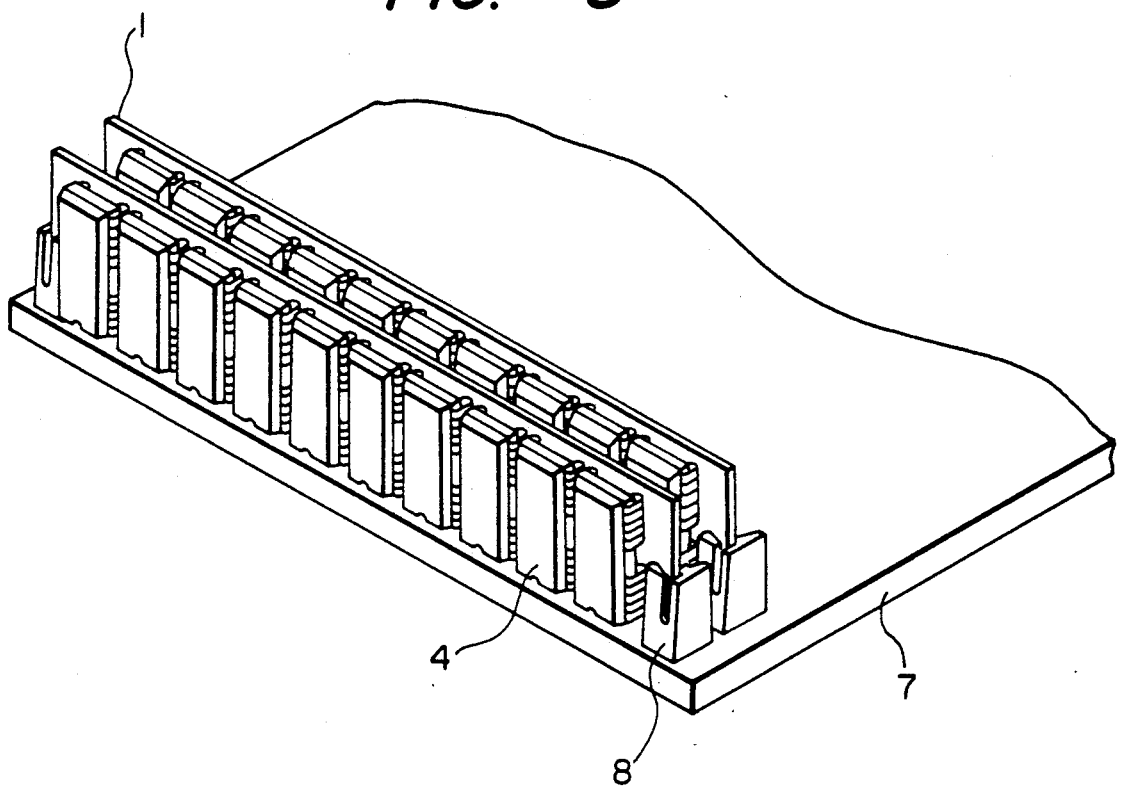
FIG. 8 is a perspective view showing the way in which the memory module board in accordance with the second embodiment of the present invention is connected to a mother board by using edge connectors.

FIG. 8 shows the way in which the memory module 1 in this embodiment is mounted on a mother board 7 by the use of edge connectors 8. In FIG. 8, the reference numeral 4 denotes the memory IC shown in FIG. 6. Each memory module board 1 corresponds to the unit denoted by MM in FIG. 7, e.g., a circuit including memory ICs denoted by M8 to M15. On the mother board 7 are mounted the above-described ICs for these memory boards and ICs which are used as a part of a microcomputer, such as a control IC and a CPU (Central Processing Unit) or an ALU (Arithmetic and Logic Unit). The above-described memory modules operate as a data register, program register and buffer register with respect to the CPU and other ICs.

Figure 9:
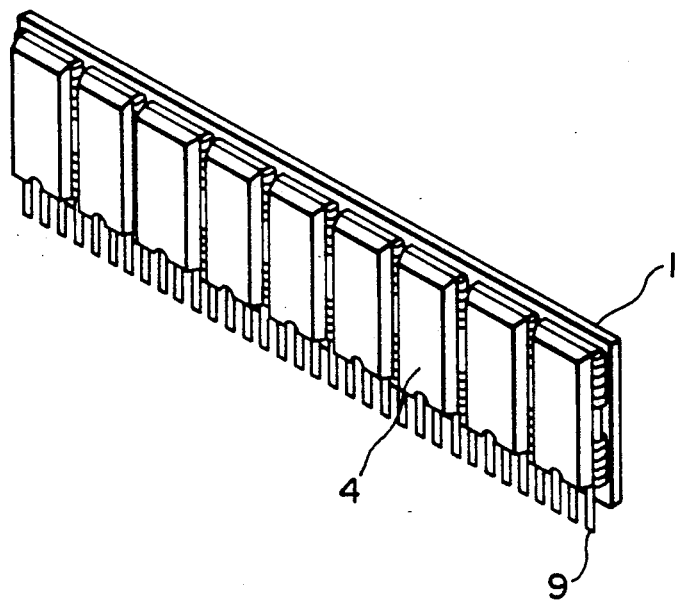
FIG. 9 is a perspective view of the memory module board in accordance with the second embodiment of the present invention which is provided with connecting pins.

As another method of mounting memory modules on an insertion type mother board, it is also possible to employ the arrangement shown in FIG. 9. More specifically, connecting pins 9 are soldered to the connecting terminal side of a memory module board 1 having memory ICs 4 mounted thereon, and the board 1 is mounted on a mother board through the connecting pins 9 which are inserted into the latter. This mounting method is mentioned in U.S. patent application Ser. No. 153,270 (filed Feb. 17, 1987), N. Seino et al., and is incorporated as a part of the description in the present invention.

Figure 23:
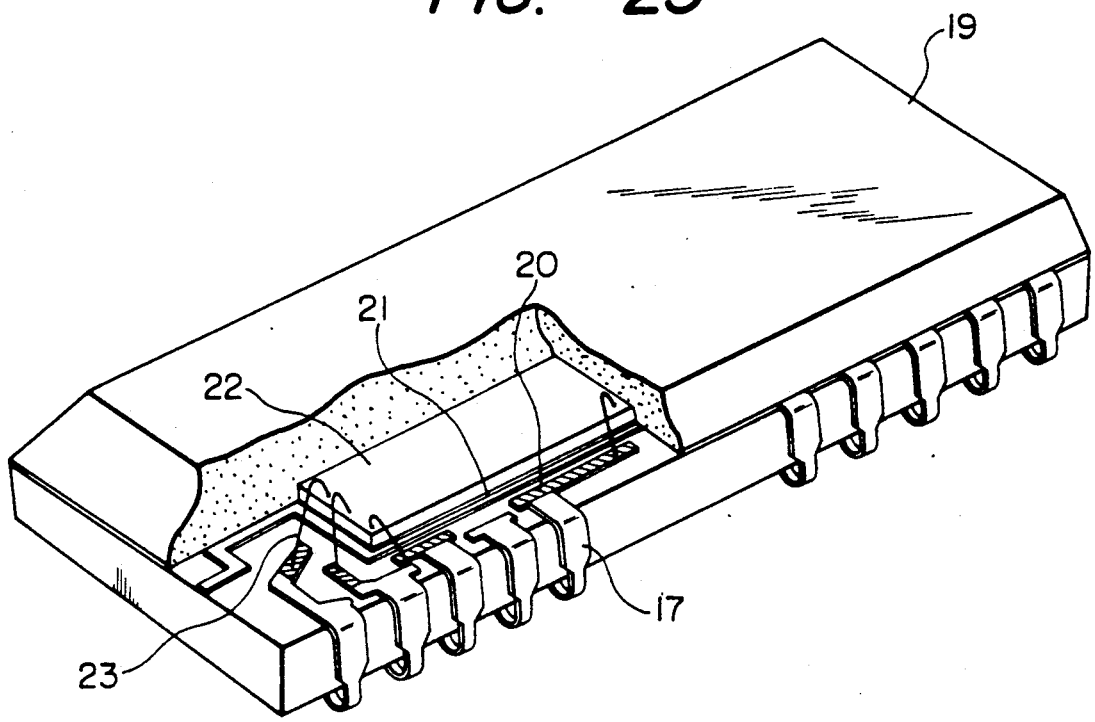
FIG. 23 is a partially-cutaway perspective view of a resin-sealed memory IC which may be used in the memory module according to the present invention.

The following is a description of resin-sealed memory ICs which are mounted on the above-described memory module board. FIG. 23 is a partially-cutaway perspective view of an SOJ type 1M-bit DRAM which corresponds to the ICs 4 shown in FIG. 5. In FIG. 23, the reference numeral 19 denotes a resin-sealed package formed in a mold by transfer molding process using an epoxy resin. The numeral 17 denotes copper leads projecting from the body of the package 19, each lead having solder plated on its external outer portion. The numeral 20 denotes a silver spot plating formed on the bonding portion of each of the inner leads. The numeral 22 denotes an IC memory chip having a 1M-bit DRAM fabricated thereon in the form of an integrated circuit, the chip being made of Si single crystal. The numeral 21 denotes a silver paste, i.e., an electrically conductive bonding material, for rigidly securing the chip 22 to a chip mounting portion, i.e., a tab region, which is made of the same material as that for the leads 17. The numeral 23 denotes Au wires (having a diameter of 30 μm) for connecting together Al bonding pads on the chip 22 and the spot plating portions of the inner leads.

Figure 24:
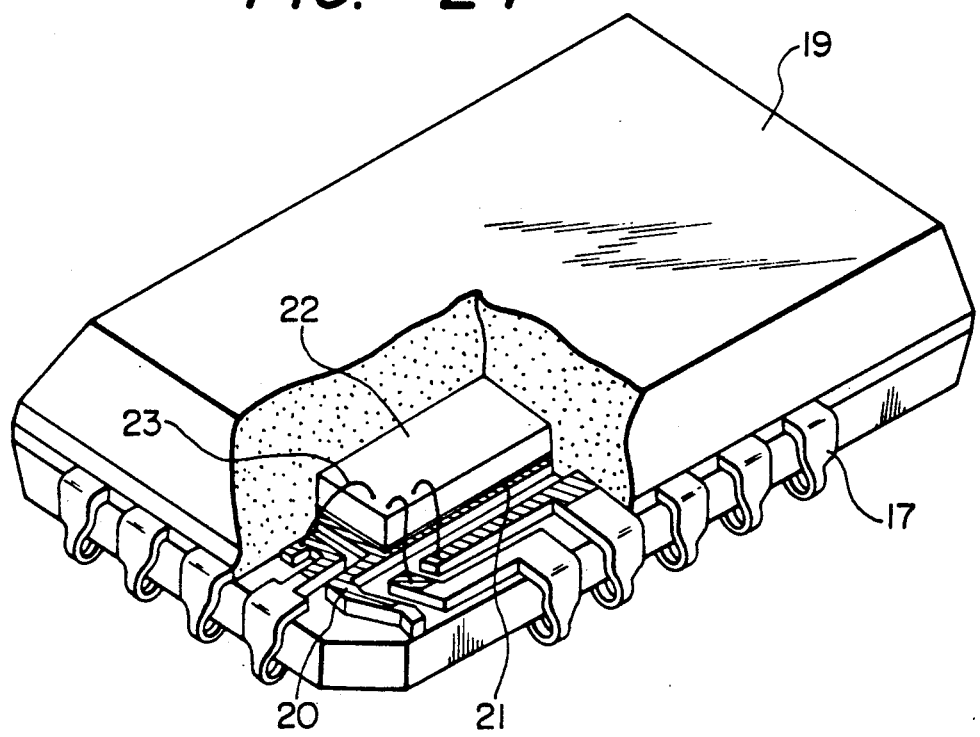
FIG. 24 is a partically-cutaway perspective view of another type of resin-sealed memory IC which may be used in the memory module according to the present invention.

Similarly, a PLCC (Plastic Leaded Chip Carrier) such as that shown in FIG. 24 may be mounted in place of the SOJ type package. In FIG. 24, the reference numerals 17, 19 to 23 denote the same members as those shown in FIG. 23.

FIGS. 10 to 19 show the process for manufacturing a wiring board which is used for a memory module according to the present invention.

Although the wiring board manufacturing process is described herein in specific correspondence to the second embodiment of the present invention, the following process may also be applied to other embodiments of the present invention in substantially the same way; therefore, description of the wiring board manufacturing process for the other embodiments is omitted.

Figure 10:
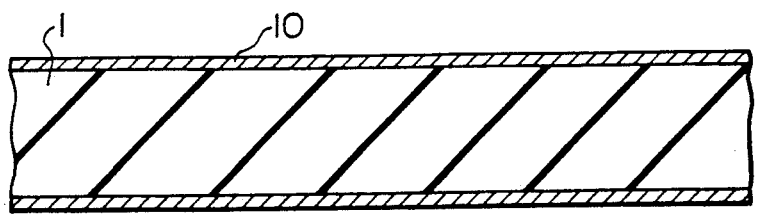
FIGS. 10 to 19 are sectional views showing the process for producing the printed board shown in FIGS. 3 and 4.

First, as shown in FIG. 10, a copper film 10 having a thickness of about 18 μm is heat-bonded using an adhesive to each side of a glass-epoxy board 1 having a thickness of about 1.27 mm to prepare an insulating board having a copper film provided on each side thereof. Materials for wiring boards such as the above-described glass-epoxy board are mentioned in U.S. patent application Ser. No. 462,060 (filed Jan. 28, 1983), and are incorporated as a part of the description of the present invention.

Figure 11:
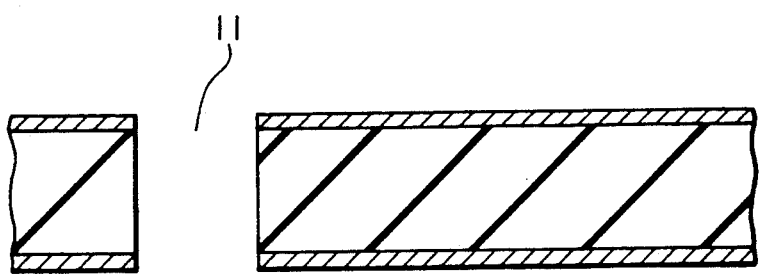
Figure 12:
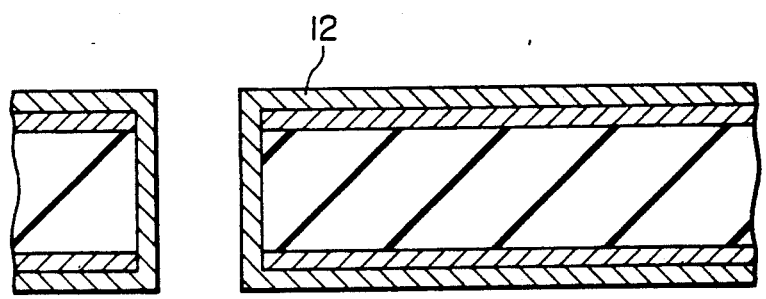

Then, a through-hole 11 having a diameter of about 0.4 mm is formed with a drill as shown in FIG. 11. After the whole surface of the board 1 has been subjected to a catalyst application treatment, a copper deposit layer 12 having a thickness of about 18 μm is formed on the inner peripheral surface of the through-hole 11 and on both the upper and lower surfaces of the board 1 as shown in FIG. 12.

Figure 13:
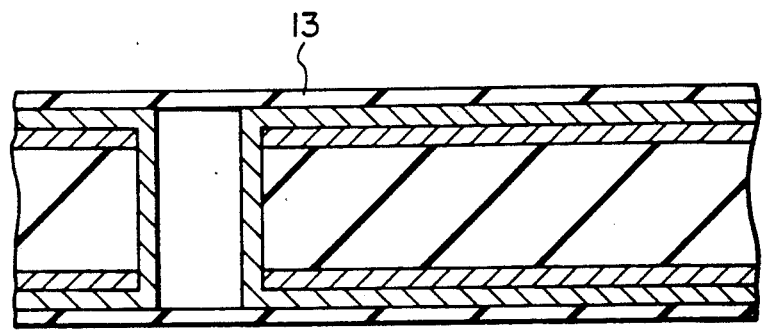
Figure 14:
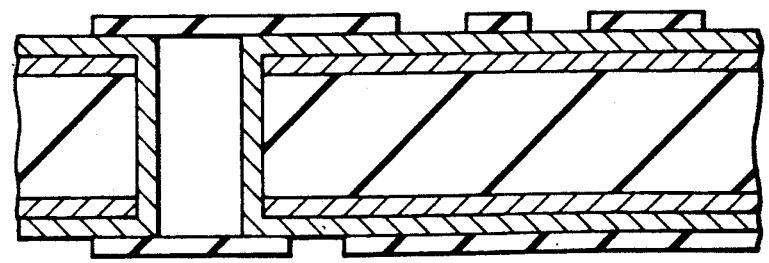
Figure 15:
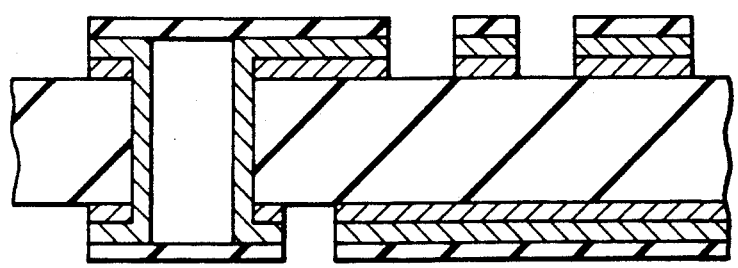
Figure 16:
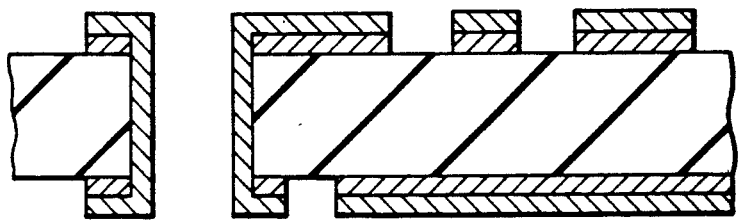

Further, as shown in FIG. 13, a positive-type photoresist Mylar film 13 is bonded to each surface of the board 1 and then exposed and developed by a known method. With the photoresist film 13 used as a mask, the copper layer 12 is etched as shown in FIG. 15. After the completion of the etching, the above-described resist is removed using, for example, copper chloride, as shown in FIG. 16.

Figure 17:
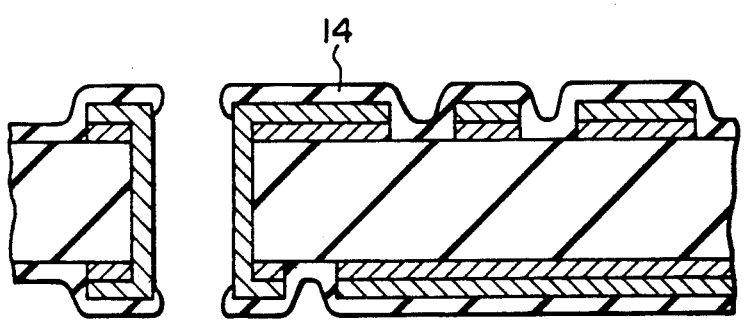
Figure 18:
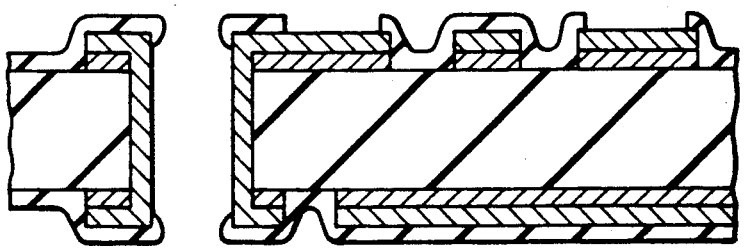

Then, a known negative type photosensitive epoxy-solder resist 14 having a thickness of about 5 μm is coated all over the obverse and reverse surfaces of the board 1 shown in FIGS. 3 and 4 for the purpose of covering with a solder resist film the whole surface except for the footprint portions and the capacitor mounting portions of the $V_{CC}$ and $V_{SS}$ strips, which are shown in FIG. 3. In practice, the through-hole portion cannot entirely be coated with the resist 14 but it is covered therewith only at the peripheries of its opening portions, as shown in FIG. 17. In this state, the upper and lower surfaces are subjected to etching by a known photolithography technique to remove the solder resist 14 from predetermined portions such as the footprint portions, as shown in FIG. 18.

Figure 19:
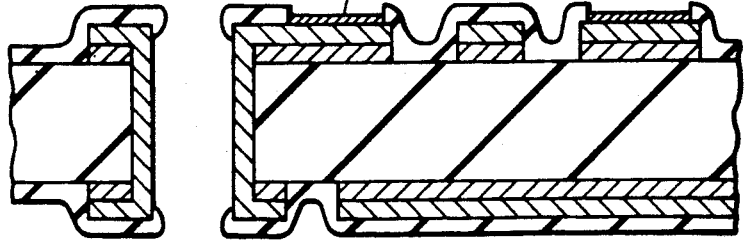

Further, the whole of the wiring board is dipped in a solder melt to attach solder to the exposed copper portions so that the surfaces of those exposed portions of the copper wiring patterns which serve as footprint portions and pad portions for edge connectors will not be oxidized by air, and before the solder cools, air is blown against the wiring board in order to blow off unnecessary solder, thereby forming a solder coat 15 having a thickness of about 0.5 to 40 μm on the footprints and the like, as shown in FIG. 19. By doing so, even if the wiring board is left to stand for a long time before memory ICs are mounted thereon, since no copper surface is exposed to and oxidized by air, there is no fear of solderability being deteriorated.

Figure 20:
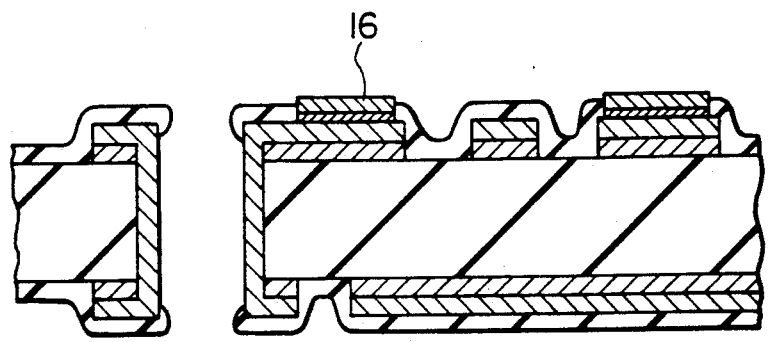
FIGS. 20 to 22 are sectional views showing the process for mounting memory ICs on the printed board produced by the process shown in FIGS. 10 to 19.
Figure 21:
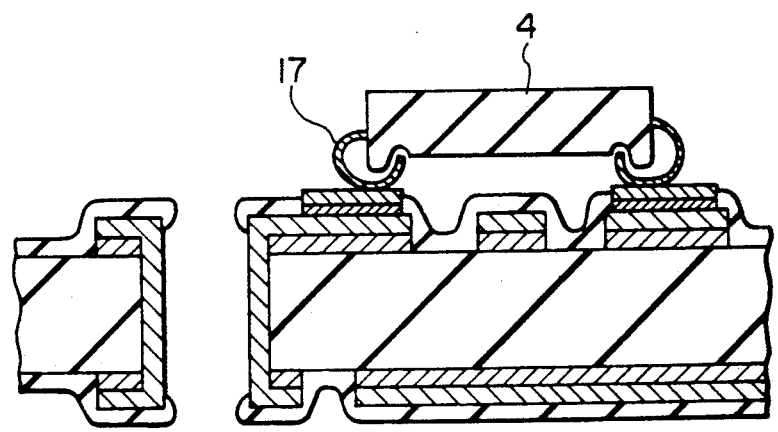
Figure 22:
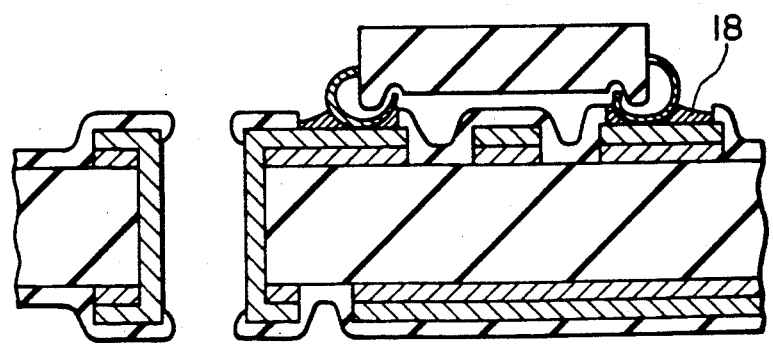
Figure 28:
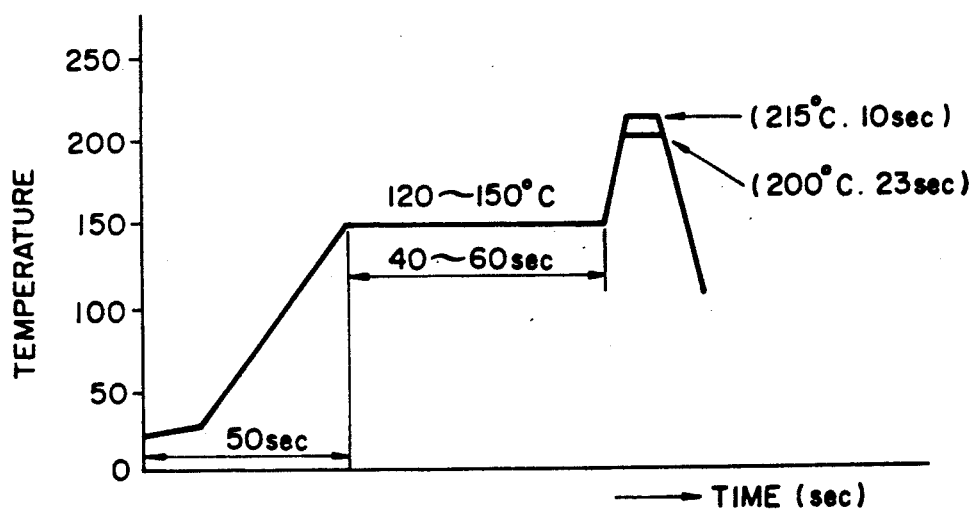
FIG. 28 shows a temperature profile in the vapor-phase reflow process.

The process for mounting memory ICs will next be explained. As shown in FIG. 20, a solder cream layer 16 which is a mixture of solder and a solder flux is formed on the footprint portions by screen printing (silk screen printing). Eight chip capacitors 5 are mounted on the corresponding footprints formed along the $V_{CC}$ and $V_{SS}$ strips on the upper surface of the board 1 so that each terminal portion of each capacitor 5 is disposed on the solder cream layer 16. Subsequently, eight memory ICs are similarly mounted so that their respective leads are disposed on the corresponding footprints, as shown in FIG. 21. In this state, the whole of the board 1 is subjected to a heat treatment as shown in FIG. 28, that is, the leads and the corresponding footprints are soldered together by a known heat treatment furnace or, vapor-phase reflow process as shown in FIG. 22.

More specifically, as shown in FIG. 3, thin copper wires such as address lines $A_0$ to $A_9$ and control or timing signal lines RAS, CAS and WE are disposed so as to extend longitudinally through the spacings between the pads for soldering the memory ICs 4, thereby enabling high-density mounting without the need to employ multilayer wirings. On the other hand, leading of the address lines which is effected laterally of the board 1, that is, the connection of the address lines to the pads for external connection, is effected by connecting them to the wirings formed on the reverse surface through the corresponding through-holes. In order to minimize the amount of lateral wirings, it is contrived that data input/output terminals which have pinouts near the pads for external connection should be communicated with these pads on the obverse surface as many as possible.

(3) Embodiment 3

Figure 25:
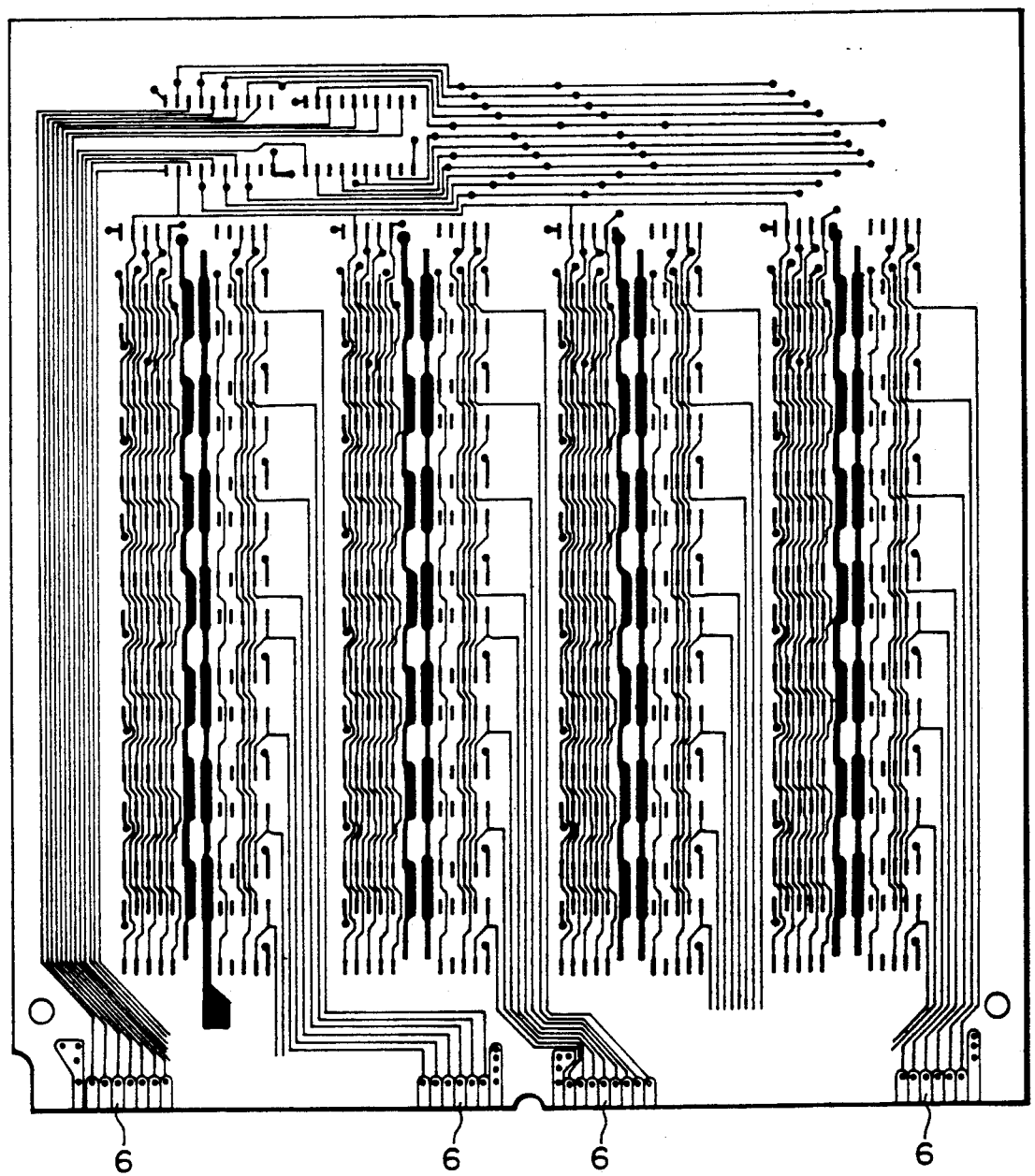
FIG. 25 is a plan view of a memory board in accordance with a third embodiment of the present invention, which shows wiring patterns on the upper surface of the wiring board.
Figure 26:
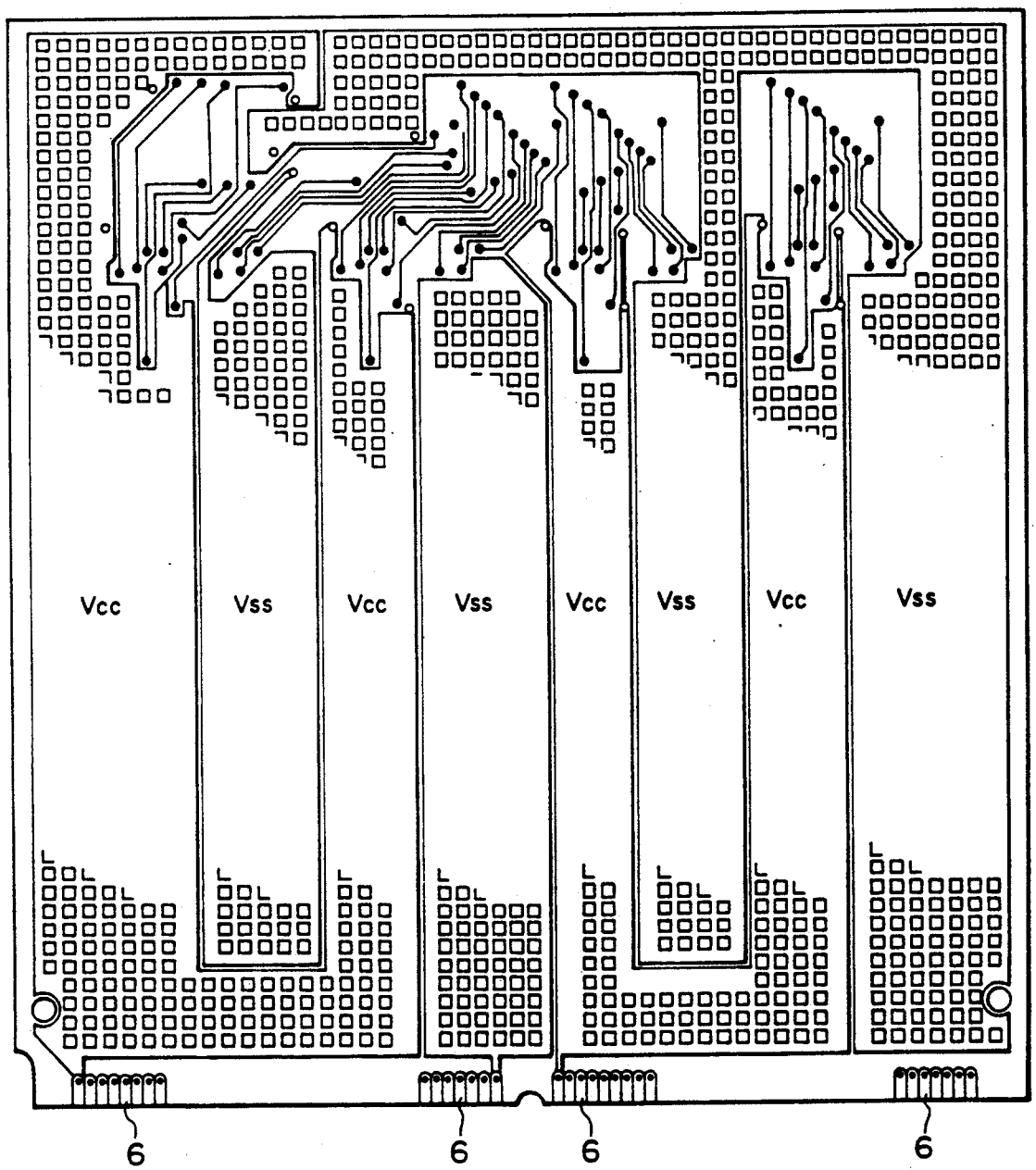
FIG. 26 is a plan view of the memory board in accordance with the third embodiment of the present invention, which shows wiring patterns on the lower surface of the wiring board as viewed from the upper side.
Figure 27:
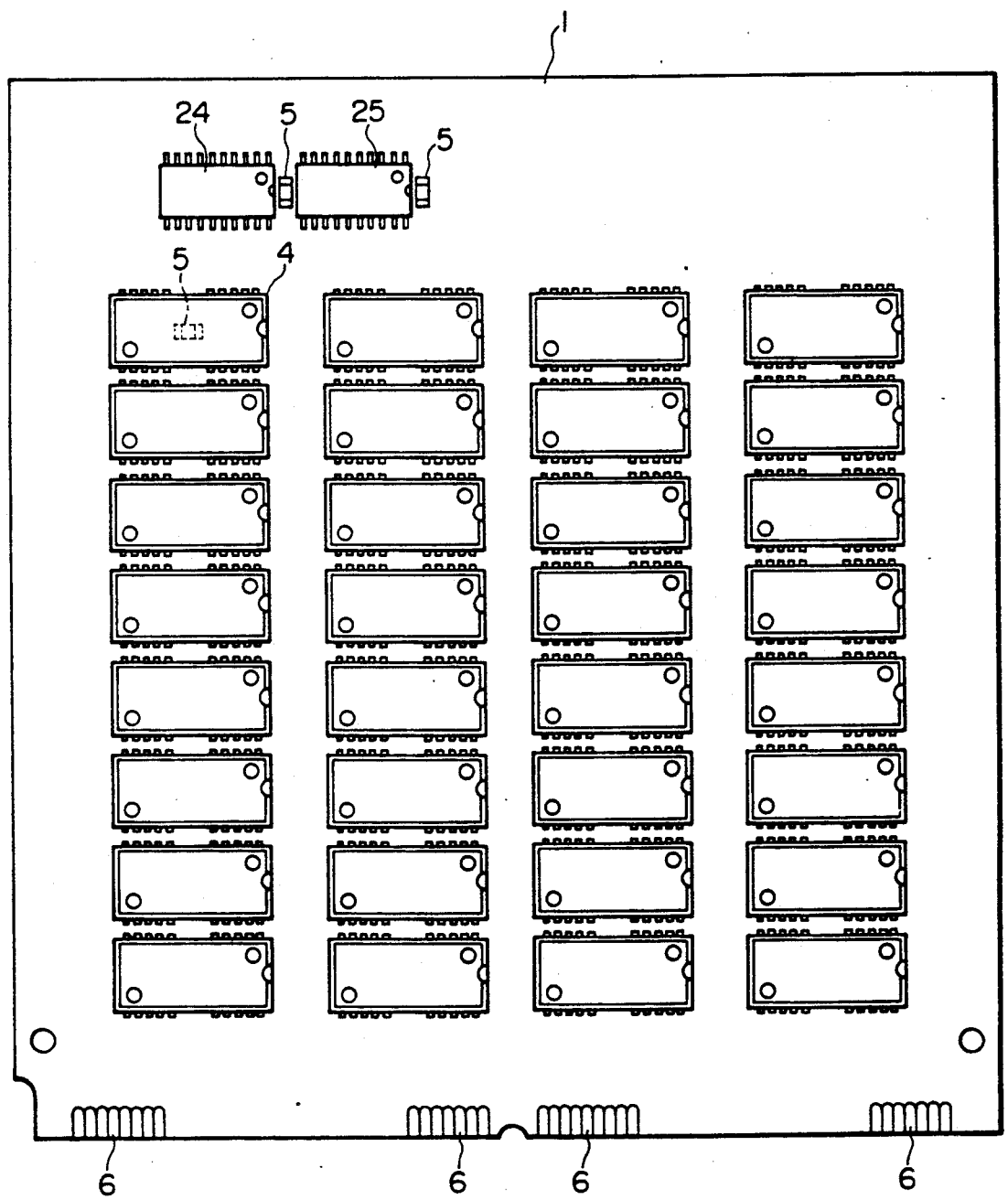
FIG. 27 is a plan view of the memory board shown in FIGS. 25 and 26, which shows the way in which memory ICs are mounted on the upper surface thereof.

The idea concerning the memory board according to Embodiment 2 can be applied to a memory board system of larger size. FIG. 25 is a plan view showing the layout of copper wirings formed on the upper surface of a glass-epoxy printed board, which corresponds to FIG. 3. Similarly, FIG. 26 is a plan view showing wiring patterns formed on the lower surface of the wiring board, which corresponds to FIG. 4. FIG. 27 is a plan view of the memory board shown in FIGS. 25 and 26, which shows the way in which SOJ type 1M-bit DRAM ICs are mounted on the upper surface thereof.

Since the concept represented by these figures is completely the same as that represented by the corresponding FIGS. 3 to 5, description of the same portions is omitted. Similarly, since the process for manufacturing the printed board and the process for mounting memory ICs are completely the same as those shown in FIGS. 10 to 22 and 28, description thereof is omitted.

FIG. 7 is a circuit diagram showing an arrangement which generally corresponds to this embodiment. The unit denoted by MM in this figure corresponds to a row of eight memory ICs which are disposed vertically as viewed in FIG. 27. In FIGS. 25 to 27, the reference numeral 6 denotes terminal portions for edge connectors, 1 a glass-epoxy board, 4 1M-bit DRAM ICs, 5 capacitors provided to cope with power supply noise, and 24, 25 driver ICs.

In FIG. 26, small square patterns which are provided on each of the $V_{CC}$ and $V_{SS}$ plates denote copper film removed portions formed by opening an integral copper plate. Provision of a multiplicity of square openings in the copper plate provided on the reverse surface allows the copper coating areas on the obverse and reverse surfaces to balance with each other, and this enables minimization of the degree at which the board 1 bends.

Provision of such bend preventing openings in the $V_{CC}$ and $V_{SS}$ plates may be applied not only to a large-sized board such as that in this embodiment but also to the board and module according to the other embodiments. The configuration of the openings is not necessarily limitative to the square shape, but the openings may be formed in any shape, for example, slits, rectangles, circles, etc. In other words, the openings may have any configuration which will not substantially interfere with such a function of the $V_{CC}$ and $V_{SS}$ plates that it is possible to supply a relatively large current.

What is claimed is:

1. A double-sided printed circuit board comprising:
   (a) a layer of substantially rectangular insulating board without inner layer wiring and with through-holes;
   (b) a plurality of soldering copper pads provided on the first principal surface of said board to which components may be mounted;
   (c) first thin copper wires provided on the first principal surface of said board for defining a plurality of signal lines,
   said first thin wires being disposed so as to extend in the longitudinal direction of said board while passing through the areas between said plurality of soldering pads;
   (d) a first copper voltage supply plate and a second copper voltage supply plate are provided on a second principal surface of said board,
   these two plates being disposed so as to cover substantially the whole of said second principal surface;
   (e) a multiplicity of pads for external connection provided on at least said second principal surface at first longer side edge portion of said board; and
   (f) second thin copper wires provided on the second principal surface of said board for defining data input/output lines,
   said second thin wires extending over said second principal surface laterally, that is, in a direction parallel to the shorter sides of said board, while passing through the areas defined between said first voltage supply plate and second voltage supply plate, so as to be connected respectively to said pads for external connection.

2. A double-sided printed circuit board according to claim 1 which further comprises:
   g) a solder resist film formed so as to cover substantially the whole of said first principal surface of said board except for said soldering pads and said through-holes.

3. A double-sided printed circuit board according to claim 2 which further comprises:
   (h) a copper pad oxidation preventing solder coat layer formed at least on said soldering pads.

4. A double-sided printed circuit board according to claim 1, wherein either of said power plates on said second principal surface has a multiplicity of openings provided over the entire plate surface.

5. A double-sided printed circuit board comprising:
   (a) a layer of substantially rectangular insulating board without inner layer wiring;
   (b) a plurality of soldering copper pads provided on the first principal surface of said board to which components may be mounted;
   (c) first thin copper wires provided on the first principal surface of said board for defining a plurality of signal lines,
   said first thin wires being disposed so as to extend in the longitudinal direction of said board while passing through the areas between said plurality of soldering pads;
   (d) a first copper voltage supply plate and a second copper voltage supply plate are provided on a second principal surface of said board,
   these two plates being disposed so as to cover substantially the whole of said second principal surface;
   (e) a multiplicity of pads for external connection provided on at least said second principal surface at first longer side edge portion of said board; and
   (f) second thin copper wires provided on the second principal surface of said board for defining data input/output lines,
   said second thin wires extending over said second principal surface laterally, that is, in a direction parallel to the shorter sides of said board, while passing through the areas defined between said first voltage supply plate and second voltage supply plate, so as to be connected respectively to said pads for external connection.

6. A double-sided printed circuit board for mounting memory integrated circuits which comprises:
   (a) a single layer, substantially rectangular insulating board without inner layer wiring;

a plurality of face mounting memory integrated circuit packages soldered to a first surface of said board, each of said memory integrated circuit packages having similar pin arrangements and a box-shaped configuration the upper surface of which is substantially rectangular, said packages being soldered to said board through a plurality of leads projecting from a pair of longer sides thereof, said plurality of packages having their longer sides juxtaposed along the length of the board to cover substantially the whole first surface of said board, (b) a multiplicity of copper pads provided on the first surface of said board to which said packages are soldered, (c) first thin copper wiring provided on the first surface of said board for defining a multiplicity of signal lines, said first thin copper wiring being disposed so as to extend in the longitudinal direction of said board while passing through the areas between said multiplicity of soldering pads;

said pins of said packages connected with each other by means of said first thin copper wiring;

(d) a first copper island-shaped plate for supplying a first power signal and a second copper island-shaped plate for supplying a second power signal, said plates being formed on a second surface of said board, said two plates being disposed so as to cover substantially the whole of said second surface;

(e) a multiplicity of external connection pads provided on at least said second surface along a first longer side edge portion of said board; and (f) second thin copper wirings provided on the second surface of said board for defining data input/output lines, said second thin copper wirings extending over said second surface laterally, that is, in a direction parallel to the shorter sides of said board, while passing through the areas defined between said power signal plates, so as to be connected respectively to said pads for external connection.

7. A double-sided printed circuit board according to claim 6 which further comprises:

(g) thin copper wiring to conduct said power signals are provided along the center area of said first surface in a direction parallel to the long sides of said board.

8. A double-sided printed circuit board having first and second principle surfaces comprising:

a) a layer of substantially rectangular insulating board without inner layer wiring;

b) a plurality of soldering pads provided on said first principal surface to which components may be mounted;

c) first thin wires provided on said first principal surface for defining a plurality of signal lines, said first thin wires being disposed so as to extend in the longitudinal direction of said board while passing through the areas between said plurality of soldering pads;

d) first and second power supply plates provided on said first and second principal surfaces, said plates on said second principal surface disposed so as to cover substantially the entire said second principal surface, and said plates on said first principal surface disposed along the central area of said first surface in a direction parallel to the longer sides of said board;

e) a plurality of pads for external connection provided on at least said second principal surface along the longer side edge portion of said board;

f) second thin wires provided on the second principal surface of said board for defining data input/output lines, said second thin wires extending over said second principal surface laterally, that is, in a direction parallel to the shorter sides of said board, while passing through the areas defined between said first and second power supply plates, said second thin wires connected respectively to said pads for external connection; and g) through-holes connecting some of said first thin wires to some of said second thin wires, wherein said plates on said first principal surface include footprint portions, at least one capacitor connecting said footprint portions.

9. A double-sided printed circuit board according to claim 8 further comprising:

h) a solder resist film formed so as to cover substantially the whole of said first principal surface of said board except for said soldering pads, said through-holes, and said footprint portions.

10. A double-sided printed circuit board according to claim 9 further comprising:

i) a copper pad oxidation preventing solder coat layer formed at least on said soldering pads.

11. A double-sided printed circuit board according to claim 8, wherein said power plates on said second principal surface include a plurality of openings provided over the surface of said plates.

12. A double-sided printed circuit board having first and second principle surfaces comprising:

a) a layer of substantially rectangular insulating board without inner layer wiring;

b) a plurality of soldering pads provided on said first principal surface to which components may be mounted;

c) first thin wires provided on said first principal surface for defining a plurality of signal lines, said first thin wires disposed so as to extend in the longitudinal direction of said board while passing through the areas between said plurality of soldering pads;

d) first and second power supply plates provided on said second principal surface, said plates on said second principal surface disposed so as to cover substantially the entire said second principal surface;

e) a plurality of pads for external connection provided on at least said second principal surface along the longer side edge portion of said board;

f) second thin wires provided on said second principal surface for defining data input/output lines, said second thin wires extending over said second principal surface laterally, that is, in a direction parallel to the shorter sides of said board, while passing through the areas defined between said first and second power supply plate, said second thin wires connected respectively to said pads for external connection; and g) a pair of power supply wirings formed on said first principal surface, at least one capacitor connecting said pair of power supply wirings, said power supply wirings provided along the central area of the board in a direction parallel to the longer sides of said board.

13. A double-sided printed circuit board having first and second surfaces for mounting memory integrated circuits comprising:
   a) a single layer, substantially rectangular insulating board without inner layer wiring;
   b) a plurality of face mounting memory integrated circuit packages mounted to said first surface, each of said memory integrated circuit packages having similar pin arrangements and a box-shaped configuration, the upper surface of which is substantially rectangular, said packages mounted to said board through a plurality of leads projecting from a pair of longer sides thereof, said plurality of packages having their longer sides juxtaposed side-by-side along the length of the board to cover substantially the entire first surface of said board;
   c) a plurality of soldering pads provided on said first surface to which said packages are mounted;
   d) first thin wiring provided on the first surface of said board for defining a plurality of signal lines, said first thin wiring disposed so as to extend in the longitudinal direction of said board while passing through the areas between said plurality of soldering pads, said pins of said packages connected to said first thin wiring;
   e) first and second island-shaped plates for supplying a first power signal and for supplying a second power signal, respectively, said plates formed on said second surface, said plates disposed so as to cover substantially the entire said second surface;
   f) a plurality of external connection pads provided on at least said second surface along the longer side edge portion of said board;
   g) second thin wiring provided on the second surface for defining data input/output lines, said second thin wiring extending over said second surface laterally, that is, in a direction parallel to the shorter sides of said board, while passing through the areas defined between said power signal plates, said second wiring connected respectively to said pads for external connection; and
   h) a pair of power supply wirings formed on said first surface, at least one capacitor connecting said pair of power supply wirings, and said power supply wirings provided along the central area of said board in a direction parallel to the longer sides of said board, wherein said power supply wirings are provided under the central area of said packages so as to avoid short circuiting between said first thin wiring and said power supply wirings.

14. A double-sided printed circuit board for mounting memory integrated circuits according to claim 13 further comprising:
   i) a plurality of capacitors disposed under said plurality of face mounting memory integrated circuit packages, said capacitors connecting said pair of power supply wirings.

15. A double-sided printed circuit board for mounting memory integrated circuits according to claim 13 further comprising:
   j) solder resist film formed so as to cover substantially the entire said first surface except for said soldering pads.

16. A double-sided printed circuit board for mounting memory integrated circuits according to claim 15 further comprising:
   k) a pad oxidation preventing solder coat layer formed at least on said soldering pads.

17. A double-sided printed circuit board for mounting memory integrated circuits according to claim 13, wherein said power plates on said second surface has a plurality of openings provided over the surface of said power plates.

18. A printed circuit board comprising:
   a) a substantially rectangular insulating board;
   b) a plurality of soldering pads provided on one surface of said board to which components may be mounted thereon;
   c) a plurality of thin wires provided on said one surface for defining a plurality of signal lines, said thin wires disposed so as to extend in the longitudinal direction of said board while passing through the areas between said plurality of soldering pads;
   d) first and second power supply plates provided on said one surface of said board, said plates on said one surface disposed along the central area of said one surface in a direction parallel to the longer sides of said board.
   wherein said plates on said one surface include footprint portions for mounting at least one capacitor, said capacitor connecting said plates.

19. A printed circuit board according to claim 18 further comprising:
   e) a solder resist film formed so as to cover substantially the entire said one surface except for said soldering pads and footprint portions.

20. A printed circuit board according to claim 19 further comprising:
   f) a pad oxidation preventing solder coat layer formed at least on said soldering pads.

21. A printed circuit board comprising:
   a) a substantially rectangular insulating board having a pair of surfaces;
   b) a plurality of soldering pads provided on one surface of said board to which components may be mounted thereon;
   c) a plurality of thin wires provided on said one surface for defining a plurality of signal lines, said thin wires disposed so as to extend in the longitudinal direction of said board while passing through the area between said plurality of soldering pads;
   d) first and second power supply plates provided on the other surface;
   e) a pair of power supply wirings, said wirings being formed on said one surface, at least one capacitor connecting said power supply wirings to each other, and said power supply wirings provided along the central area of said board in a direction parallel to the longer sides of said board.

22. A printed circuit board for mounting memory integrated circuits comprising:
   a) a substantially rectangular insulating board;
   b) a plurality of face mounting memory integrated circuit packages soldered to a surface of said board, each of said memory integrated circuit packages having similar pin arrangements and a box-shaped configuration, the upper surface of which is substantially rectangular, said packages soldered to said board through a plurality of leads projecting from a pair of longer sides thereof, said plurality of packages having their longer sides juxtaposed side-by-side along the length of the board to cover substantially the entire said surface;

c) a plurality of soldering pads provided on said surface to which said packages are soldered;

d) first thin wiring provided on said one surface of said board for defining a plurality of signal lines, said first thin writing disposed so as to extend in the longitudinal direction of said board while passing through the areas between said plurality of soldering pads, said pins of said packages connected to said first thin wiring;

e) a pair of power supply wirings formed on said one surface, at least one capacitor connecting said power supply wirings to each other, and said power supply wirings provided along the central area of said board in a direction parallel to the long sides of said board, wherein said pair of power supply wirings are provided under the central area of said packages so as to avoid short circuiting between said first thin wiring and said pair of power supply wirings.

23. A printed circuit board for mounting memory integrated circuits according to claim 22 further comprising:

f) a plurality of capacitors disposed under the plurality of face mounting memory integrated circuit packages, said capacitors connecting said pair of power supply wirings.

24. A printed circuit board for mounting memory integrated circuits according to claim 22 further comprising:

g) a solder resist film formed so as to cover substantially the entire said surface of said board except for said soldering pads.

25. A printed circuit board for mounting memory integrated circuits according to claim 24 further comprising:

h) a copper pad oxidation preventing solder coat layer formed at least on said soldering pads.

* * * * *